US009746168B1

(12) United States Patent
Wu

(10) Patent No.: US 9,746,168 B1
(45) Date of Patent: Aug. 29, 2017

(54) LIGHT-EMITTING TOUCH BUTTONS

(71) Applicant: American Opto Plus LED Corporation, Pomona, CA (US)

(72) Inventor: Eric Cheng Yuan Wu, Walnut, CA (US)

(73) Assignee: American Opto Plus LED Corporation, Pomona, CA (US)

( * ) Notice: Subject to any disclaimer, the term of this patent is extended or adjusted under 35 U.S.C. 154(b) by 14 days.

(21) Appl. No.: 14/928,348

(22) Filed: Oct. 30, 2015

(51) Int. Cl.
*F21V 23/06* (2006.01)
*F21V 23/04* (2006.01)
*H03K 17/96* (2006.01)
*F21Y 101/02* (2006.01)

(52) U.S. Cl.
CPC .......... *F21V 23/0485* (2013.01); *F21V 23/06* (2013.01); *H03K 17/96* (2013.01); *H03K 17/9631* (2013.01); *F21Y 2101/02* (2013.01); *H03K 2017/9613* (2013.01)

(58) Field of Classification Search
CPC .......................... H03K 17/96–17/9638; H03K 2017/9602–2017/9615; F21V 23/0485; F21V 23/06
See application file for complete search history.

(56) References Cited

U.S. PATENT DOCUMENTS

| | | |
|---|---|---|
| 5,697,493 A | 12/1997 | Sach et al. |
| 6,234,651 B1 | 5/2001 | Kodama et al. |
| 6,737,596 B1 | 5/2004 | Hein |
| 7,098,414 B2 | 8/2006 | Caldwell |
| 7,258,469 B2 | 8/2007 | Manico et al. |
| 7,498,534 B2 | 3/2009 | Hoyle |
| 7,582,840 B2 | 9/2009 | Lerenius |
| 7,612,306 B2 | 11/2009 | Klinghult et al. |
| 7,671,289 B2 | 3/2010 | Matsukawa et al. |
| 7,705,257 B2 | 4/2010 | Arione et al. |
| 7,915,553 B2 | 3/2011 | Arione et al. |
| 8,049,124 B2 | 11/2011 | Jang et al. |

(Continued)

OTHER PUBLICATIONS

Hudson, "Using light emitting diode arrays as touch-sensitive input and output devices." *Proceedings of the 17th annual ACM symposium on User interface software and technology.* ACM (2004) 287-290.

(Continued)

*Primary Examiner* — Mariceli Santiago
(74) *Attorney, Agent, or Firm* — Knobbe, Martens, Olson & Bear LLP

(57) ABSTRACT

A light-emitting touch button can include a first printed circuit board (PCB), a second PCB, and a pin coupling the first PCB to the second PCB. The first PCB can include first electronics to detect a touch event on a touch surface. The second PCB can include second electronics to control light emission. The pin can communicate the detected touch event from the first electronics to the second electronics. The touch button can also include a housing including one or more walls defining one or more light-emitting regions. One or more light sources can be disposed within the one or more light-emitting regions. The second electronics can control light emitted from the one or more light sources based at least in part on the detected touch event. The one or more walls can collimate the light emitted from the one or more light sources to the touch surface.

36 Claims, 5 Drawing Sheets

(56) References Cited

U.S. PATENT DOCUMENTS

| | | |
|---|---|---|
| 8,242,397 B2 | 8/2012 | Fu |
| 8,253,692 B2 | 8/2012 | Lai |
| 8,258,987 B2 | 9/2012 | Anorozo |
| 8,310,839 B2 | 11/2012 | Arione et al. |
| 8,319,128 B2 | 11/2012 | Bronstein et al. |
| 8,330,385 B2 | 12/2012 | Salter et al. |
| 8,390,481 B2 | 3/2013 | Pance et al. |
| 8,552,936 B2 | 10/2013 | Hente |
| 8,759,699 B2 | 6/2014 | Yuasa |
| 8,780,068 B2 | 7/2014 | Lin |
| 8,803,016 B2 | 8/2014 | Kang |
| 2009/0090605 A1* | 4/2009 | Arione ................. H03K 17/962 200/314 |
| 2011/0187204 A1* | 8/2011 | Lacey .................... H03K 17/96 307/139 |
| 2012/0020032 A1* | 1/2012 | Huang .................... A44B 1/04 361/748 |
| 2013/0001058 A1 | 1/2013 | Bowler et al. |
| 2013/0062181 A1 | 3/2013 | Tokura et al. |
| 2014/0340353 A1 | 11/2014 | Chen et al. |
| 2015/0114810 A1 | 4/2015 | Tanoue et al. |
| 2015/0123936 A1* | 5/2015 | Keller ................. H03K 17/962 345/174 |

OTHER PUBLICATIONS

Kim et al, "A highly sensitive capacitive touch sensor integrated on a thin-film-encapsulated active-matrix OLED for ultrathin displays." *IEEE Transactions on Electron Devices*, vol. 58, No. 10 (Oct. 2011) 3609-3615.

\* cited by examiner

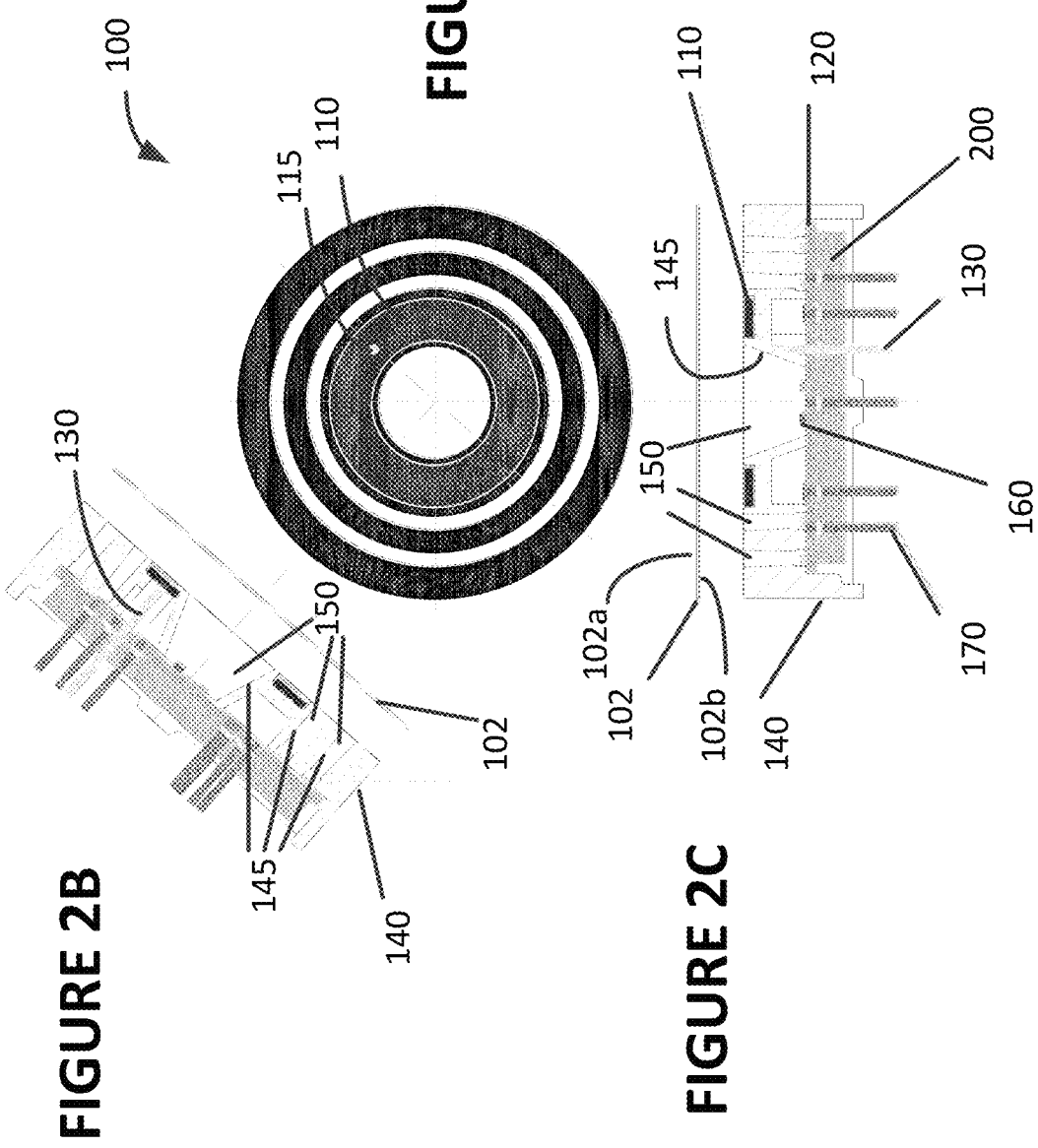

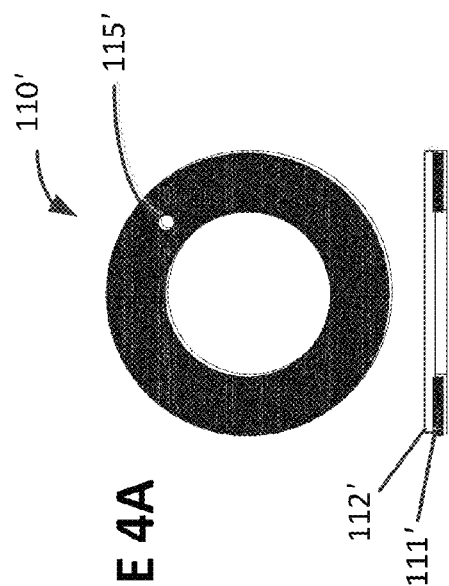
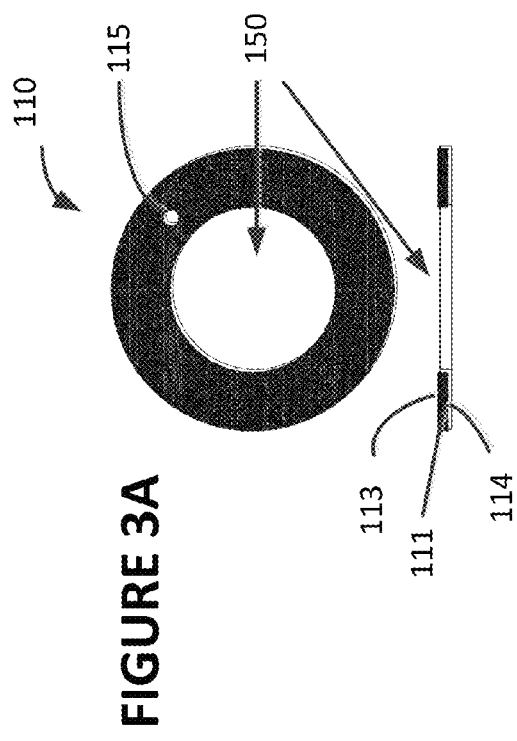

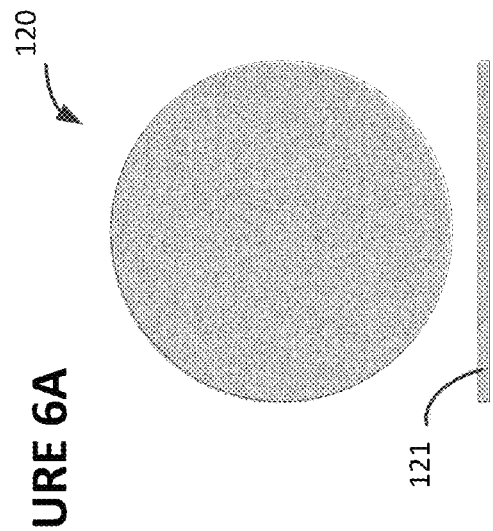
FIGURE 6A
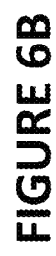
FIGURE 6B
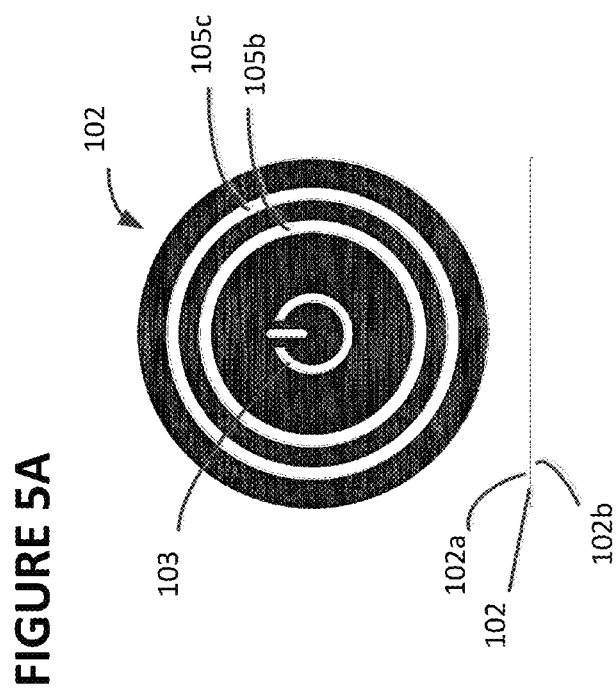
FIGURE 5A
FIGURE 5B

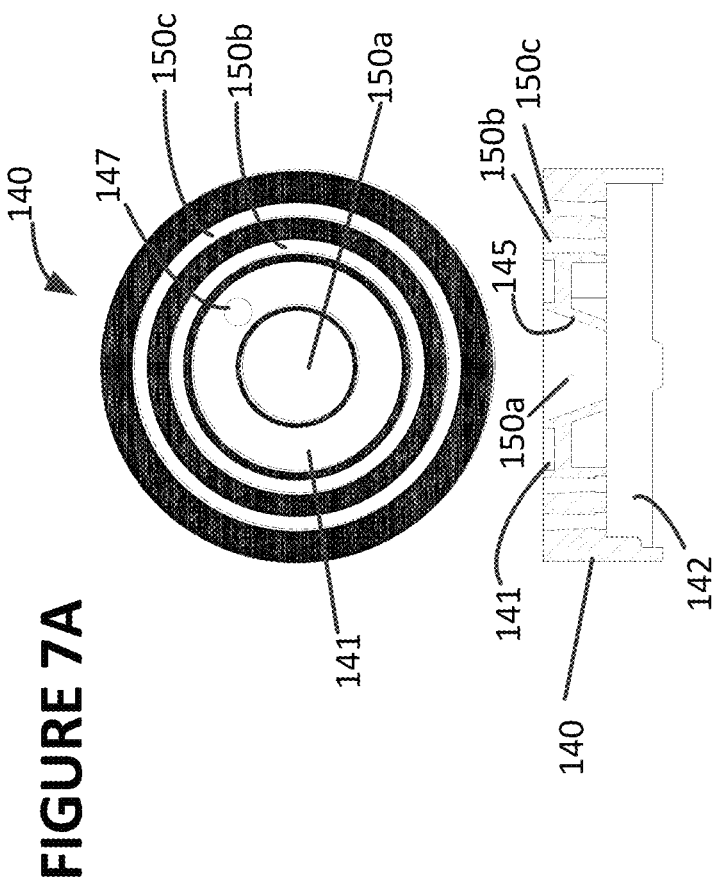

LIGHT-EMITTING TOUCH BUTTONS

BACKGROUND

Field of the Invention

This disclosure relates to light-emitting touch buttons.

Description of the Related Art

A light-emitting touch button is used in various electronic devices. For example, electronic devices can include one or more touch buttons to perform various functions. A touch button often includes one or more letters, numbers, characters, icons, symbols, or pictures such that when the touch button is activated, the one or more letters, numbers, characters, icons, symbols, or pictures can light up. A touch button that allows for various designs to be implemented, and is simple to manufacture using existing materials and processes, is desirable.

SUMMARY

In certain embodiments, a light-emitting touch button is provided. The light-emitting touch button can include a first printed circuit board (PCB), a second PCB, and a pin coupling the first PCB to the second PCB. The first PCB can include first electronics configured to detect a touch event on a touch surface. The second PCB can be disposed at a distance from the first PCB. The second PCB can include second electronics configured to control light emission. The pin can communicate the detected touch event from the first electronics to the second electronics.

In various embodiments, the touch button can include a housing including one or more walls defining one or more light-emitting regions. The touch button can also include one or more light sources disposed within the one or more light-emitting regions. The one or more light sources can also be coupled to the second PCB such that the second electronics can be configured to control light emitted from the one or more light sources based at least in part on the detected touch event. For example, the second electronics can be configured to control light emitted from the one or more light sources such that the one or more light sources can switch between emitting and not emitting light upon each touch and subsequent touch event. The one or more walls can be configured to collimate the light emitted from the one or more light sources to the touch surface.

In some embodiments of the light-emitting touch button, the housing can include a recess and the first PCB can be disposed at least partially within the recess. In various embodiments, the light-emitting touch button can further include at least one layer of material disposed above the first PCB. For example, the layer can include a decorative film or can include a cap. In some embodiments, the touch surface can include a top surface of the layer. In some such embodiments, the first PCB can be attached to a bottom surface of the layer.

In various embodiments, the first PCB can include a conductive pad and the first electronics can be configured to detect a change in capacitance of the conductive pad. In some such embodiments, the touch surface can include a surface of the conductive pad. In some embodiments, the first PCB can include a substrate on which the first electronics are disposed. The touch surface can include a surface of the substrate.

In some embodiments, the one or more light sources can include a plurality of light sources. The one or more light-emitting regions can include a plurality of light-emitting regions separated by portions of the housing. Each light-emitting region can include at least one light source or a plurality of light sources. In some embodiments, the one or more light sources can include a light-emitting diode.

In various embodiments, a first light-emitting region can have a first cross-sectional shape and a second light-emitting region can have a second cross-sectional shape. The second cross-sectional shape can surround the first cross-sectional shape. In addition, a third light-emitting region can have a third cross-sectional shape surrounding the second cross-sectional shape. In some embodiments, the first cross-sectional shape can be circular and the second cross-sectional shape can be annular. In addition, the third cross-sectional shapes can also be annular. In some embodiments, the first PCB can include an annular cross-sectional shape. The second PCB can include a circular cross-sectional shape. In some embodiments, the touch button can include one or more connector pins connecting the second PCB to an electronic device.

BRIEF DESCRIPTION OF THE DRAWINGS

FIG. 2A illustrates a top view of an example light-emitting touch button in accordance with certain embodiments described herein.

FIGS. 2B and 2C illustrate cross-sectional views of the example light-emitting touch button shown in FIG. 2A.

FIGS. 3A and 3B illustrate a top view and a cross-sectional view respectively of the example first printed circuit board (PCB) of the touch button shown in FIGS. 2A-2C.

FIGS. 4A and 4B illustrate a top view and a cross-sectional view respectively of another example first PCB compatible with the touch button shown in FIGS. 2A-2C.

FIGS. 5A and 5B illustrate a top view and a cross-sectional view respectively of an example layer disposed over the first PCB.

FIGS. 6A and 6B illustrate a top view and a cross-sectional view respectively of the example second PCB of the touch button shown in FIGS. 2A-2C.

FIGS. 7A and 7B illustrate a top view and a cross-sectional view respectively of the example housing of the touch button shown in FIGS. 2A-2C.

DETAILED DESCRIPTION

Figure 1:
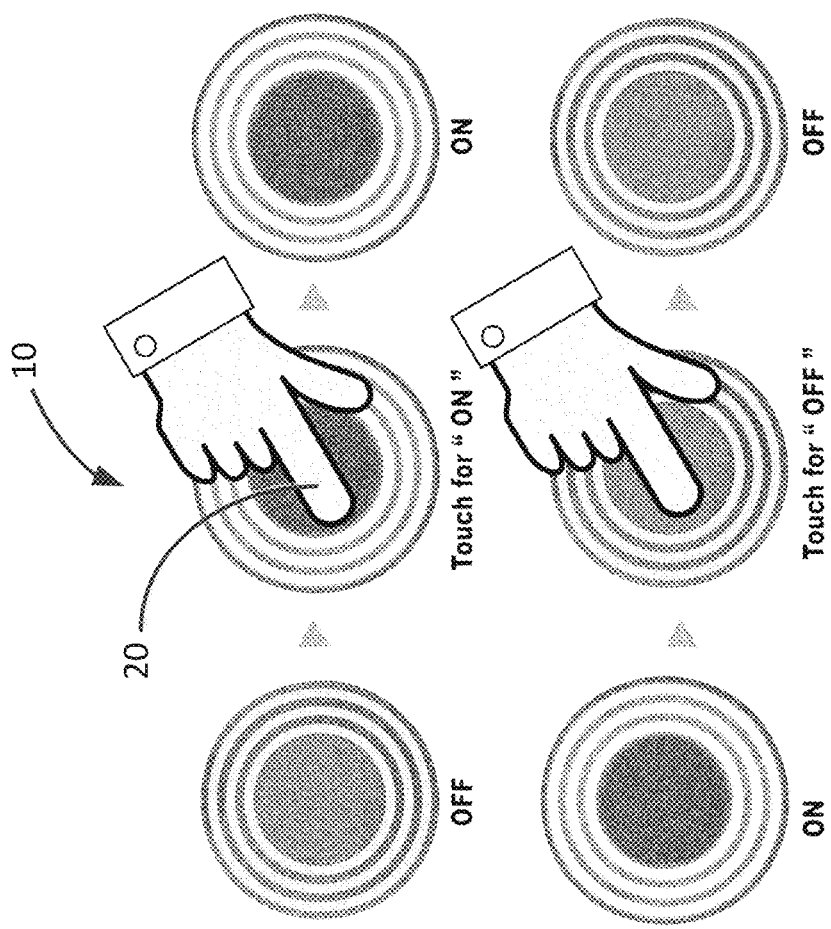
FIG. 1 illustrates an example light-emitting touch button in operation.

Certain embodiments described herein provide a light-emitting touch button. The touch button can "light up" when activated via a touch event on a touch surface. For example, the touch button can have "on" and "off" modes, where the touch button lights up in the "on" mode and does not light up in the "off" mode (or vice versa). In some instances, the touch button can toggle between the "on" and "off" modes with each touch and subsequent touch event. FIG. 1 illustrates an example light-emitting touch button 10 in operation. The touch button 10 can begin in the "off" mode. A touch event can occur when a user touches the touch button 10 with an object 20, such as a finger or a stylus. The object 20 can be conductive or non-conductive. This touch event can switch the touch button 10 from the "off" mode to the "on" mode, thereby lighting up the touch button 10. As shown in FIG. 1, a subsequent touch event can switch the touch button 10 back to the "off" mode.

In operation, the touch button can include a touch sensing function, e.g., to detect a touch event, and a light controlling function, e.g., to control the light emitting from the touch button. In certain embodiments described herein, the touch button can integrate both the touch sensing function and the light controlling function within a single package. Furthermore, in various embodiments described herein, the touch button can be designed to any size and shape by simply designing the housing of the package and/or the printed circuit board (PCB) to be tailored to the intended touch button design.

FIGS. 2A-2C illustrate various views of an example light-emitting touch button 100 in accordance with certain embodiments described herein. In FIG. 2A, a top view is illustrated. Similar to the example touch button 10 shown in FIG. 1, the example touch button 100 shown in FIG. 2A is designed such that the touch button 100 emits light in a concentric pattern. Of course, other designs are possible. FIGS. 2B-2C illustrate two cross-sectional views of the example touch button 100. In particular, FIG. 2B shows a front cross-sectional view, and FIG. 2C shows a side cross-sectional view.

In various embodiments, the light-emitting touch button 100 can include a first printed circuit board (PCB) 110 and a second PCB 120. The first PCB 110 can include first electronics (not shown) configured to detect a touch event of an object. The second PCB 120 can include second electronics (not shown) configured to control light emission. The light-emitting touch button 100 can also include a pin 130 coupling the first PCB 110 to the second PCB 120 to communicate the detected touch event from the first electronics to the second electronics. Accordingly, the second electronics on the second PCB 120 can be configured to control the light emitted from the touch button 100 based at least in part on the detected touch event.

A touch event can occur when an object, such as a finger, directly or indirectly contacts a touch surface of the touch button 100, or when the object is in sufficiently close proximity (for example, within the range of about 7 mm, within the range of about 10 mm, or within the range of about 15 mm, such as about 1 mm, about 2 mm, about 3 mm, about 5 mm, about 7 mm, about 10 mm, about 15 mm, or any range in between) to the touch surface of the touch button 100. In some embodiments, the touch surface of the touch button 100 can include a layer 102 disposed over the first PCB 110. The layer 102 can include a first surface 102a and a second surface 102b. The first surface 102a can face the user such that the user can touch the layer 102 on the first surface 102a.

In various embodiments, by having a pin 130 coupling the first PCB 110 (e.g., including the first electronics configured to detect a touch event) to the second PCB 120 (e.g., including the second electronics configured to control the light emitted from the touch button 100), the first PCB 110 can be coupled (e.g., glued) to the second surface 102b or can be integrated with the layer 102 thereby improving touch sensitivity. In some embodiments, the first PCB 110 can include a hole 115 configured to receive the pin 130. In some applications, the desired sensitivity may be relatively high such that a touch event can be sensed within a specific distance range. However, in some other applications, it may be desired that the touch button 100 is not activated at a distance, but when the touch button 100 is actually contacted. The actual sensitivity is not particularly limited and the desired sensitivity can be designed into the touch button 100. For example, in some embodiments, a sensing region with a larger area can tend to have higher touch sensitivity than for a smaller area. As another example, some sensing technology can have higher touch sensitivity than others. Sensing technology can include capacitive touch, resistive touch, mechanical pressure sensing, etc. Any sensing technology known in the art or yet to be developed can be implemented. In some embodiments, it may be possible that the first PCB 110 is sufficiently close (e.g., within about 3 mm, within about 2 mm, or within about 1 mm, etc.) to the layer 102 without being coupled to or integrated with the layer 102.

The light-emitting touch button 100 can include a housing 140 comprising one or more walls 145 defining one or more light-emitting regions 150. One or more light sources 160 can be disposed within each light-emitting region 150. Each light source 160 can be coupled to the second PCB 120 such that the second electronics are configured to control light emitted from each light source 160 based at least in part on the detected touch event. The walls 145 of the housing 140 can be configured to collimate the light emitted from the light sources 160 to the touch surface (e.g., surface 102a). In some embodiments, the touch button 100 can include one or more connector pins 170. The connector pins 170 can be configured to connect the touch button 100 to an electronic device (e.g., represented by 200).

As described herein, in certain embodiments, a user can switch the touch button 100 between "on" and "off" modes by touch events on the touch button 100 with an object, such as a finger. In various embodiments, the first PCB 110 can be disposed within the sensing area, e.g., coupled to or integrated with the touch surface where the touch event occurs. The first PCB 110 can include first electronics configured to detect the touch events, e.g., to provide the touch sensing function of the touch button 100.

FIG. 3A illustrates a top view and FIG. 3B illustrates a cross-sectional view of the first PCB 110 of the example touch button 100 shown in FIGS. 2A-2C. The first PCB 110 in this example is in a shape of an annular ring. Because the design pattern of the example touch button 100 in FIGS. 2A-2C emits light in a concentric pattern, a first PCB 110 having an annular ring shape can be advantageously placed in the touch button 100 such that it does not block light emission from the light-emitting regions 150. However, the first PCB 110 can be designed in any shape, which is not particularly limited. In other words, the first PCB 110 can be designed to any shape to fit various kinds of designs. For example, the shape of the first PCB 110 can be based on the application of the touch button 100 and/or the desired sensing area. The shape can be a symmetrical, non-symmetrical, regular, or irregular shape. In one example, the first PCB 110 can be in the shape of a tree branch. The first PCB 110 can also be designed to any size to fit various kinds of designs. In some embodiments, a relatively small size or a portion of the PCB 110 can be utilized in the touch button 100 to reduce costs.

The first electronics disposed on the first PCB 110 can include those known in the art or yet to be developed. In other words, the first electronics are not particularly limited as long as they can provide a sensing capability. As one example, the first electronics can include a conductive pad (e.g. a metal pad such as a copper pad) and the first electronics can detect a change in capacitance of the conductive pad. As another example, the first PCB 110 can include a spring attached to an integrated circuit, and the first electronics can detect a disturbance in the magnetic field. As described herein, the sensing technology is not particularly limited. In addition, the touch sensitivity of the first PCB 110 is not particularly limited and can be based on the application. For example, if the intended user is expected to wear gloves having a certain thickness, the touch sensitivity of the first PCB 110 can be designed to take into account this thickness. The first electronics can be disposed on one side of the first PCB 110, on both sides of the first PCB 110, or on multiple layers of the first PCB 110.

For example, in various embodiments, the first PCB 110 can include a substrate 111 on which the first electronics are disposed. For example, the substrate 111 can have a first surface 113 and a second surface 114. The first electronics can be disposed on the first surface 113, the second surface 114, or both the first surface 113 and the second surface 114. The first electronics can be attached to the substrate 111 using solder or a glue (e.g., a conductive glue such as silver epoxy). The substrate 111 can provide mechanical support and allow the first electronics to be electrically connected as appropriate. The shape of the substrate 111 can define the shape of the first PCB 110, e.g., an annular ring in this example. The size (including the thickness) of the substrate 111 is not particularly limited. In some instances, the substrate 111 can be non-conductive, while the electronics can include conductive electronic components (e.g., electrical traces made of conductive metal such as gold plating). In various embodiments, the substrate 111 can be a plastic. The substrate 111 can be opaque, transparent, or partly-transparent. In various embodiments, the substrate 111 can include a hole 115 configured to receive the pin 130 coupling the first PCB 110 to the second PCB 120. Although the first PCB 110 in this example is shown as having a single substrate 111, it would be appreciated that the first PCB 110 can have multiple substrates. For example, the substrate 111 can include multiple substrates with the electronics disposed on the multiple substrates.

As another example, FIG. 4A illustrates a top view and FIG. 4B illustrates a cross-sectional view of another example of a first PCB 110' compatible with the touch button 100 shown in FIGS. 2A-2C. In this example, the first PCB 110' includes a first substrate 111' and a second substrate 112'. The first substrate 111' can be similar to the substrate 111 shown in FIGS. 3A and 3B. The second substrate 112' can be attached to the first substrate 111'. The size and shape of the second substrate 112' are not particularly limited and can be different than those of the first substrate 111'. In the example shown in FIGS. 4A and 4B, the second substrate 112' has a similar outer circular shape as the first substrate 111'. However, in some embodiments, the second substrate 112' can have a larger circular shape than the first substrate 111' or even a different shape (e.g., a square, rectangle, or other polygon).

In various embodiments, the first PCB 110' can be disposed in the touch button 100 shown in FIGS. 2A-2C with the second substrate 112' closer to the user (e.g., closer to surface 102a). In some embodiments, the second substrate 112' can provide additional support and/or protection for the first electronics. In some instances, the second substrate 112' can be transparent (or partly transparent) so as to not block light emission from the light-emitting regions 150. The second substrate 112' can also function as the touch surface in some embodiments (e.g., in some embodiments not including layer 102).

Accordingly, in some embodiments, the touch surface can include a surface of the first PCB 110'. For example, referring to FIGS. 4A and 4B, at least part of the second substrate 112' on a side facing the user can form at least part of the touch surface configured to receive the touch event, e.g., either directly or indirectly. In some such embodiments, the first electronics can be disposed on the first substrate 111' on the side adjacent the second substrate 112'. In some other embodiments, the first electronics can be disposed on the first substrate 111' on the side opposite the second substrate 112'. In yet some other embodiments, the first electronics can be disposed on the first substrate 111' on the side adjacent and on the side opposite the second substrate 112'. As another example, referring to FIGS. 3A and 3B, at least part of the first surface 113 of the substrate 111 can face the user and form at least part of the touch surface. In some such embodiments, the first electronics can be disposed on the second surface 114 of the substrate 111. As yet another example, as described herein, the first PCB 110 can include a conductive pad. In some such embodiments, the conductive pad can be disposed in the touch button 100 shown in FIGS. 2A-2C such that the conductive pad faces the user. At least part of the conductive pad in some embodiments can form at least part of the touch surface.

With continued reference to FIGS. 2A-2C, as described previously, the touch surface can include a surface of a layer 102 disposed above the first PCB 110. For example, in various embodiments, the touch button 100 can include a layer 102 disposed over the first PCB 110. The layer 102 can include a first surface 102a and a second surface 102b. In some embodiments, the touch surface includes the first surface 102a. For example, the first surface 102a, e.g., the top surface, can be disposed over the PCB 110 facing the user. In various embodiments, the first PCB 110 can contact and even be attached to the second surface 102b, e.g., the bottom surface, of the layer 102. However, in some embodiments, the first PCB 110 does not contact the layer 102.

FIG. 5A shows a top view and FIG. 5B shows a cross-sectional view of an example layer 102. The layer 102, e.g., the first surface 102a, can include one or more letters, numbers, characters, icons, symbols, pictures, etc. In this example, the layer 102 includes a design of the power on/off symbol 103 surrounded by two concentric circles 105b, 105c. In such a design, the layer 102 can include transparent (or partly-transparent) and non-transparent portions allowing the design to "light up" through the transparent portions (e.g., corresponding to the power on/off symbol 103 and the two concentric circles 105b, 105c). The non-transparent portions can cover the underlying components (e.g., the first PCB 110) from the user's view. The size (including thickness), shape, and design of the layer 102 are not particularly limited. In some instances, the layer 102 can include multiple layers. In some such embodiments, the touch surface can include a top surface of the uppermost layer. In some embodiments where the first PCB 110 contacts and/or attaches to the layer 102, the first PCB 110 can contact and/or attach to the bottommost layer of the multiple layers.

In some embodiments, the layer 102 can include a decorative film having a desired design. The materials used for the film are not particularly limited and can include transparent or semi-transparent materials. As another example, the layer 102 can include a cap. In some such embodiments, a design can be disposed on the cap, e.g., a design printed on the cap or adhered to the cap. Portions of the cap can be transparent and/or semi-transparent to allow the cap to "light up". Materials used for the cap can include glass or plastic. In various embodiments, the materials for the film and/or cap are not conductive. Further, in some embodiments, the film and/or cap can be coupled (e.g., glued) to or integrated with the first PCB 110.

With continued reference to FIGS. 2A-2C, the second PCB 120 can be disposed at a distance from the first PCB 110. In various embodiments, the second PCB 120 can be disposed in the touch button 100 closer to the light sources 160. FIG. 6A illustrates a top view and FIG. 6B illustrates a cross-sectional view of the second PCB 120 of the example touch button 100 shown in FIGS. 2A-2C. Because of the circular design of the example touch button 100, the second PCB 120 in this example is in a circular shape. However, the size, shape, and design of the second PCB 120 are not particularly limited.

The second PCB 120 can include second electronics configured to control light emission. In various embodiments, the second PCB 120 can include a substrate 121 that provides mechanical support and allows the second electronics to be electrically connected as appropriate. The material of the substrate 121 can be the same or different than the substrate 111 of the first PCB 110. For example, the substrate 121 of the second PCB 120 can be non-conductive and the second electronics can include conductive electronic components (e.g., electrical traces made of conductive metal such as gold plating). The second electronics can be attached to the substrate 121 using solder or a glue (e.g., a conductive glue such as silver epoxy).

The second electronics disposed on the second PCB 120 can be configured to control light emission based at least in part on the detected touch event from the first PCB 110. The second electronics can include those known in the art or yet to be developed. In other words, the second electronics are not particularly limited as long as they can provide control of light emission, e.g., from one or more light sources as described herein. The second electronics can be disposed on one side of the second PCB 120, on both sides of the first PCB 120, or on multiple layers of the second PCB 120. In some instances, the substrate 121 can include multiple substrates with electronics disposed on the multiple substrates.

With continued reference to FIGS. 2A-2C, in various embodiments, the touch button 100 can include a pin 130 configured to communicate the detected touch event from the first electronics on the first PCB 110 to the second electronics on the second PCB 120. The pin 130 can include a metal through-pin having a length extending between and coupling the first PCB 110 to the second PCB 120. For example, the pin 130 can be coupled to the first PCB 110 via the hole 115 in the first PCB 110. The pin 130 can also be coupled to the second PCB 120 via a hole (not shown) or to electronics on the second PCB 120. The pin 130 can be attached to the hole 115 and/or the second PCB 120 using solder. For example, the pin 130 can be attached to the hole 115 and the second PCB 120 using solder. In other embodiments, the pin 130 can be attached to the hole 115 and/or the second PCB 120 using or glue (e.g., a conductive glue such as silver epoxy). For example, the pin 130 can be attached to the hole 115 and the second PCB 120 using glue.

After receiving the detected touch event from the first electronics, the second electronics on the second PCB 120 can control light emission by controlling the light sources 160. In some embodiments, the touch button 100 can switch between two modes upon each touch and subsequent touch event. For example, as described herein, the touch button 100 can toggle between an "on" mode and an "off" mode. In some such embodiments, the second electronics can control the light emission by turning on or off one or more light sources with each touch and subsequent touch event. In other examples, instead of switching between "on" and "off," the touch button 100 can switch between other two modes such as between two different colors of light (e.g., between red and green light) or between flashing and non-flashing light. In addition, instead of switching between the two modes with each touch and subsequent touch event, other patterns are possible and can be determined by the second electronics. For example, the first mode can be activated by a single touch event, and the second mode can be activated by a double touch event (e.g., two touches). The two modes of the touch button 100 are not particularly limited and can be designed in an integrated circuit for use in the touch button 100.

It would also be appreciated that in various embodiments, the touch button 100 can have more than two modes of operation. For example, the touch button 100 can include multiple modes to emit various intensity levels of light (e.g., between relatively low and relatively high levels of light). In some such embodiments, the second electronics can control light emission by increasing (or decreasing) the intensity of one or more light sources upon each touch and subsequent touch event (or upon some other touch pattern). In one example, two sensing areas adjacent to each other can provide more than two modes of operation. In some such embodiments, actuating the first sensing area can provide the first mode of operation. Actuating the second sensing area can provide the second mode of operation. Actuating both sensing areas (e.g., when the area between the two sensing areas is contacted) can provide an additional mode of operation. In some embodiments, two or more adjacent sensing areas can be used in such a way to provide a sliding operation. For example, as an object slides across the sensing areas, each of the multiple modes can be activated in turn. For use in a light bar display, the sliding operation can increase or decrease the intensity of the emitted light. As described herein, the multiple modes of the touch button 100 are not particularly limited and can be designed in an integrated circuit for use in the touch button 100.

With continued reference to FIGS. 2A-2C, the touch button 100 can further include a housing 140. FIG. 7A illustrates a top view and FIG. 7B illustrates a cross-sectional view of the housing 140 of the example touch button 100 shown in FIGS. 2A-2C. In various embodiments, the housing 140 can be designed to accommodate the desired design of the touch button 100. For example, as shown in FIG. 7B, the housing 140 can include a recess 141. The recess 141 can be sized and shaped such that the first PCB 110 can be disposed at least partially within the recess 141 (see, e.g., FIGS. 2A-2C). In some such examples, the recess 141 can have a size and shape corresponding to at least part of the first PCB 110. However, in some other embodiments, the recess 141 does not necessarily have a shape corresponding to at least part of the first PCB 110, but can be at least slightly larger to accommodate housing the first PCB 110. As shown in FIG. 7A, the housing 140 can also include a hole 147 corresponding to the hole 115 in the first PCB 110.

With continued reference to FIG. 7B, the housing 140 can also include another recess 142 sized and shaped such that the second PCB 120 can be disposed at least partially within the recess 142 (see, e.g., FIGS. 2A-2C). In some such embodiments, the recess 142 can have a size and shape corresponding to at least part of the second PCB 120. However, in some other embodiments, the recess 142 does not necessarily have a shape corresponding to at least part of the second PCB 120, but can be at least slightly larger to accommodate housing the second PCB 120. Accordingly, in various embodiments, the housing 140 can accommodate both the first PCB 110 and the second PCB 120 such that the touch button 100 can integrate the touch sensing function and the light controlling function within a single package.

Advantages of the embodiments of the example touch button 100 shown in FIGS. 2A-2C include having the first PCB 110 including first electronics providing the touch sensing function to be coupled to or integrated with the touch surface 102a (e.g., improving the sensitivity of the touch sensing function), and having the second PCB 120 including second electronics providing the light controlling function to be disposed relatively close to the light sources 160. In some embodiments, by having the touch sensing function on a separate PCB 110 from the light emitting function, the light emitting area from the second PCB can be greater. However, in modified embodiments, the first electronics providing the touch sensing function and the second electronics providing the light controlling function can be disposed on the same PCB. For example, the first electronics and the second electronics can both be disposed on the second PCB 120, eliminating the first PCB 110. In some such embodiments, the sensing area (e.g., sensing pad) can be incorporated on the same level as the light sources. As another example, the first electronics and the second electronics can both be disposed on the first PCB 110, eliminating the second PCB 120. In such modified examples, the touch button 100 also can integrate the touch sensing function and the light controlling function within a single package. In some such embodiments, the touch button 100 can use an integrated or the same circuitry for the sensing electronics and the light controlling electronics.

With continued reference to FIGS. 2A-2C, the housing 140 can also include one or more walls 145 defining one or more light-emitting regions 150 such that the light-emitting regions 150 are separated by portions of the housing 140 (see also light-emitting regions 150*a*, 150*b*, 150*c* in FIGS. 7A-7B). The design of light-emitting regions can depend on the desired design. In this example, as shown in the cross-sectional view in FIGS. 7A-7B, the walls 145 define the circular center region 150*a* and two concentric circular regions 150*b*, 150*c*. For example, the first light-emitting region 150*a* has a first cross-sectional shape, e.g., a circular cross-sectional shape. The second light-emitting region 150*b* has a second cross-sectional shape, e.g., an annular cross-sectional shape, surrounding the first cross-sectional shape. In addition, the third light-emitting region 150*c* has a third cross-sectional shape, e.g., an annular cross-sectional shape, surrounding the second cross-sectional shape. Other designs are possible.

Within each light-emitting region 150 as shown in FIGS. 2A-2C, the touch button 100 can include one or more light sources 160. The light sources 160 can include any light sources known in the art or yet to be developed. For example, the light sources 160 can include light-emitting diodes (LEDs). The light sources 160 can include white light sources or colored light sources (e.g., red, green, or blue light sources). Each light source 160 can be coupled to the second PCB 120 such that, as described herein, the second electronics on the second PCB 120 can control light emitted from each light source 160 based at least in part on the detected touch event. For example, as described herein, the second electronics can control one or more lights sources 160 to turn on or off, to control the timing of light emission (e.g., flashing intermittently), or to emit varying intensities of light (e.g., between relatively low and relatively high levels of light). Other examples are possible.

In certain embodiments, the walls 145 of the housing 140 can be configured to collimate the light emitted from the light sources 160 to the touch surface 102*a*. Accordingly, in various embodiments, when the light is emitted from the light sources 160 to the touch surface 102*a* within the light-emitting regions 150 (or e.g., light-emitting regions 150*a*, 150*b*, 150*c* in FIGS. 7A-7B), the touch button 100 can "light up" the desired design. In various embodiments, the housing 140 can be made of a plastic material. In some embodiments, the housing 140 can be made of non-conductive material. The housing 140 can be made of materials and processes known in the art or can be made of materials and processes yet to be developed. In some embodiments, the walls 145 of the housing 140 can be coated with a reflective material, e.g., a metal layer, to enhance light reflection. As described herein, various embodiments of the touch button 100 can be manufactured using existing materials and processes, which can be beneficial in some cases (e.g., no need for additional costs associated with implementing the use of new materials, equipment, and procedures). In addition, various embodiments of the touch button 100 can be adapted to be manufactured using new materials and processes, which can be beneficial in some other cases (e.g., to take advantage of new technology).

As described herein, various electronic devices (e.g., microwaves, refrigerators, washers, dryers, etc.) can include one or more light-emitting touch buttons 100 to perform various functions. Accordingly, as shown in FIGS. 2A-2C, in various embodiments, the touch button 100 can include one or more connector pins 170 connecting the second PCB 120 to an electronic device (e.g., represented by 200). Since an electronic device 200 can include multiple touch buttons 100, in some modified embodiments, multiple touch buttons can be incorporated into a single package. Furthermore, in some modified embodiments, various components of the touch button 100 can be shared among the multiple touch buttons 100. For example, the first PCB 110, the second PCB 120, the pin 130 coupling the first PCB 110 to the second PCB 120, the housing 140, and/or one or more light sources 160 can be shared among multiple touch buttons 100.

Various modifications to the embodiments described in this disclosure may be readily apparent to those skilled in the art, and the generic principles defined herein may be applied to other embodiments without departing from the spirit or scope of this disclosure. For example, certain features that are described in this specification in the context of separate embodiments also can be implemented in combination in a single embodiment. Conversely, various features that are described in the context of a single embodiment also can be implemented in multiple embodiments separately or in any suitable sub-combination.

What is claimed is:

1. A light-emitting touch button comprising:
   a first printed circuit board (PCB) comprising first electronics configured to detect a touch event on a touch surface;
   at least one layer of material disposed above the first PCB, the touch surface comprising a top surface of the at least one layer, the first PCB attached to a bottom surface of the at least one layer;
   a second PCB disposed at a distance from the first PCB, the second PCB comprising second electronics configured to control light emission;
   a pin coupling the first PCB to the second PCB to communicate the detected touch event from the first electronics to the second electronics;
   a housing comprising one or more walls defining one or more light-emitting regions; and
   one or more light sources disposed within the one or more light-emitting regions and coupled to the second PCB such that the second electronics are configured to control light emitted from the one or more light sources based at least in part on the detected touch event, and the one or more walls are configured to collimate the light emitted from the one or more light sources to the touch surface.

2. The light-emitting touch button of claim 1, wherein the second electronics are configured to control light emitted from the one or more light sources such that the one or more light sources switch between emitting and not emitting light upon each touch and subsequent touch event.

3. The light-emitting touch button of claim 1, wherein the housing comprises a recess and the first PCB is disposed at least partially within the recess.

4. The light-emitting touch button of claim 1, wherein the at least one layer comprises a decorative film.

5. The light-emitting touch button of claim 1, wherein the at least one layer comprises a cap.

6. The light-emitting touch button of claim 1, wherein the first PCB comprises a conductive pad and the first electronics are configured to detect a change in capacitance of the conductive pad.

7. The light-emitting touch button of claim 1, wherein the at least one layer of material comprises a conductive pad.

8. The light-emitting touch button of claim 6, wherein the first PCB comprises a substrate on which the first electronics are disposed.

9. The light-emitting touch button of claim 1, wherein the one or more light sources comprise a plurality of light sources.

10. The light-emitting touch button of claim 9, wherein the one or more light-emitting regions comprise a plurality of light-emitting regions separated by portions of the housing, each light-emitting region comprising at least one light source of the plurality of light sources.

11. The light-emitting touch button of claim 10, wherein each light-emitting region comprises a plurality of light sources.

12. The light-emitting touch button of claim 10, wherein a first light-emitting region has a first cross-sectional shape and a second light-emitting region has a second cross-sectional shape, the second cross-sectional shape surrounding the first cross-sectional shape.

13. The light-emitting touch button of claim 12, wherein a third light-emitting region has a third cross-sectional shape surrounding the second cross-sectional shape.

14. The light-emitting touch button of claim 12, wherein the first cross-sectional shape is circular and the second cross-sectional shape is annular.

15. The light-emitting touch button of claim 13, wherein the first cross-sectional shape is circular, the second and third cross-sectional shapes are annular.

16. The light-emitting touch button of claim 1, wherein the first PCB comprises an annular cross-sectional shape.

17. The light-emitting touch button of claim 1, wherein the second PCB comprises a circular cross-sectional shape.

18. The light-emitting touch button of claim 1, wherein the one or more light sources comprise a light-emitting diode.

19. The light-emitting touch button of claim 1, further comprising one or more connector pins connecting the second PCB to an electronic device.

20. A light-emitting touch button comprising:
   a first printed circuit board (PCB) comprising first electronics configured to detect a touch event on a touch surface;
   a second PCB disposed at a distance from the first PCB, the second PCB comprising second electronics configured to control light emission;
   a pin coupling the first PCB to the second PCB to communicate the detected touch event from the first electronics to the second electronics;
   a housing comprising one or more walls defining a plurality of light-emitting regions separated by portions of the housing; and
   a plurality of light sources, at least one light source of the plurality of light sources disposed within a corresponding light-emitting region of the plurality of light-emitting regions and coupled to the second PCB such that the second electronics are configured to control light emitted from the at least one light source based at least in part on the detected touch event, and the one or more walls are configured to collimate the light emitted from the at least one light source to the touch surface.

21. The light-emitting touch button of claim 20, wherein the second electronics are configured to control light emitted from the at least one light source such that the at least one light source switches between emitting and not emitting light upon each touch and subsequent touch event.

22. The light-emitting touch button of claim 20, wherein the housing comprises a recess and the first PCB is disposed at least partially within the recess.

23. The light-emitting touch button of claim 20, further comprising at least one layer of material disposed above the first PCB, wherein the touch surface comprises a top surface of the at least one layer, wherein the first PCB is attached to a bottom surface of the at least one layer, and wherein the at least one layer comprises a decorative film.

24. The light-emitting touch button of claim 20, further comprising at least one layer of material disposed above the first PCB, wherein the touch surface comprises a top surface of the at least one layer, wherein the first PCB is attached to a bottom surface of the at least one layer, and wherein the at least one layer comprises a cap.

25. The light-emitting touch button of claim 20, wherein the first PCB comprises a conductive pad and the first electronics are configured to detect a change in capacitance of the conductive pad.

26. The light-emitting touch button of claim 25, wherein the touch surface comprises a surface of the conductive pad.

27. The light-emitting touch button of claim 25, wherein the first PCB comprises a substrate on which the first electronics are disposed, and the touch surface comprises a surface of the substrate.

28. The light-emitting touch button of claim 20, wherein each light-emitting region comprises more than one light source of the plurality of light sources.

29. The light-emitting touch button of claim 20, wherein a first light-emitting region has a first cross-sectional shape and a second light-emitting region has a second cross-sectional shape, the second cross-sectional shape surrounding the first cross-sectional shape.

30. The light-emitting touch button of claim 29, wherein a third light-emitting region has a third cross-sectional shape surrounding the second cross-sectional shape.

31. The light-emitting touch button of claim 29, wherein the first cross-sectional shape is circular and the second cross-sectional shape is annular.

32. The light-emitting touch button of claim 30, wherein the first cross-sectional shape is circular, the second and third cross-sectional shapes are annular.

33. The light-emitting touch button of claim 20, wherein the first PCB comprises an annular cross-sectional shape.

34. The light-emitting touch button of claim 20, wherein the second PCB comprises a circular cross-sectional shape.

35. The light-emitting touch button of claim 20, wherein the at least one light source comprises a light-emitting diode.

36. The light-emitting touch button of claim 20, further comprising one or more connector pins connecting the second PCB to an electronic device.

* * * * *